United States Patent [19]
Lee et al.

[11] Patent Number: 5,654,928
[45] Date of Patent: Aug. 5, 1997

[54] CURRENT SENSE AMPLIFIER FOR USE IN A SEMICONDUCTOR MEMORY DEVICE

[75] Inventors: Kyu-Chan Lee, Seoul; Jai-Hoon Sim, Gunpo, both of Rep. of Korea

[73] Assignee: Samsung Electronics Co. Ltd.

[21] Appl. No.: 639,261

[22] Filed: Apr. 23, 1996

[30] Foreign Application Priority Data

Apr. 28, 1995 [KR] Rep. of Korea ............ 10324/1995

[51] Int. Cl.$^6$ ............................................. G11C 7/00
[52] U.S. Cl. ............... 365/205; 365/207; 365/208; 327/51; 327/55; 327/57
[58] Field of Search ........................... 365/205, 207, 365/208; 327/51, 52, 55, 57

[56] References Cited

U.S. PATENT DOCUMENTS

| | | | |
|---|---|---|---|
| 4,771,194 | 9/1988 | Van Zeghbroeck | 365/205 |
| 4,831,287 | 5/1989 | Golab | 327/55 |
| 5,134,319 | 7/1992 | Yamaguchi | 327/52 |
| 5,457,657 | 10/1995 | Suh | 327/51 |

*Primary Examiner*—Son T. Dinh
*Attorney, Agent, or Firm*—Marger, Johnson, McCollom & Stolowitz

[57] ABSTRACT

A current sense amplifier for use in a semiconductor memory device having a pair of sub-I/O lines and a pair of I/O lines includes a first circuit leg having a first PMOS transistor in series with a second NMOS transistor. A second circuit leg has a third PMOS transistor in series with a fourth NMOS transistor. The gates of the PMOS transistors are each cross coupled to the drain of the other PMOS transistor. The gates of the NMOS transistor are each cross coupled to the source of the PMOS transistor in the other circuit leg. The source of each PMOS transistor comprises a sub-Input/Output line with an Input/Output line located between the transistors in each of the legs.

13 Claims, 2 Drawing Sheets

CURRENT SENSE AMPLIFIER FOR USE IN A SEMICONDUCTOR MEMORY DEVICE

BACKGROUND OF THE INVENTION

1. Field of the Invention

The present invention relates to a current sense amplifier for use in a semiconductor memory device and more particularly to such an amplifier capable of performing accurate sensing operations using a low power supply voltage.

2. Description of the Related Art

As the density of semiconductor memory devics increases, operating power supply voltages decrease thereby also reducing current consumption. In the case of, e.g., a dynamic random access memory implemented with CMOS technology, this narrows the range of voltages used to represent one of two binary states. It is desireable, therefore, to provide the most accurate possible sensing to determine the state of a memory cell. Accurate amplification of voltage levels on bit lines is therefore highly desirable. Due to the trend in decreasing power-supply voltages for semiconductor memory devices, it is difficult to sense the voltage difference between complementary voltage levels on a pair of bit lines.

In one prior art semiconductor memory device, after information stored in the memory cell is developed by a bit line sense amplifier, it is transmitted to an input/output (I/O) line. The power supply voltage is proportional to the voltage difference between a pair of bit lines. For low voltage power supplies, the difference between the potentials on the bit lines is also low. This reduces the sensing margin of an I/O line sense amplifier and makes it difficult to determine the state of a line. In order to overcome this difficulty, a current sense amplifier is provided wihich is able to sense current generated by a voltage level developed by a bit line sense amplifier. When using such a current sense amplifier, a pair of sub-I/O lines are connected between a pair of bit lines and a pair of I/O lines. The bit line potential on the sub-I/O lines is used to develop a current which is easily sensed by the current sense amplifier. The current sense amplifier uses the current to generate corresponding voltage levels on the I/O lines. A current sensing circuit utilizing sub-I/O lines is disclosed in papers entitled "A Dynamic Current-Offset Calibration (DCC) Sense Amplifier with Fish-Bone shaped Bit line (FBB) for High Density SRAMs", on pages 115 to 116 of a publication "1994 VLSI Symposium", by J. Takahashi, et al., entitled "A Current Sense-Amplifier for Fast CMOS SRAMs", on pages 71 to 72 of a publication "1990 VLSI Symposium", by E. Seevinck, et al., and entitled "A 9ns 16Mb CMOS SRAM with Offset Reduced Current Sense Amplifier", on pages 248 to 249 of a publication "1993 ISSCC", by K. Seno, et al.

As power supplies continue to provide lower voltages, the threshold voltages of transistors used in a current sense amplifier are high enough so that proper operation of the current sense amplifier is impeded. An example of a prior art current sense amplifier coupled to a core part of a semiconductor memory device is depicted schematically in FIG. 1 with signal wave forms thereof depicted in FIG. 2. The above-described distadvantages associated with the prior art current sense amplifier will become more fully apparent after the following description of the structure and operation of the circuit of FIG. 1.

In FIG. 1, the bit lines BL and nBL (nBL being depicted in the drawing by BL with a bar thereover) are connected to a memory cell array 10. A pair of transistors 12, 14, which are driven by column selection signals CSL, gate bit lines from memory cell 10 onto sub-I/O lines SIO, nSIO, (nSIO being depicted in the drawing by SIO with a bar thereove) respectively. Lines SIO, nSIO are tied to the bit lines via transistors 12, 14 and to the power supply voltage Vet via biasing resistors 28, 30, respectively. Lines SIO, nSIO are connected to input terminals of the current sense amplifier 16, which is designated by dashed lines. Output terminals of sense amplifier 16 are connected to I/O lines IO, nIO.

Current sense amplifier 16 includes PMOS transistors 18, 20 which each have sources connected to the sub-IO lines SIO, nSIO, respectively. Drains of PMOS transistors 18, 20 are connected to those of NMOS transistors 22, 24, respectively. The PMOS transistors include gates which are cross-coupled with the drains of the opposite PMOS transistors. Sources of NMOS transistors 22, 24 are coupled to each other and are also connected in common to a drain of an NMOS transistor 26. The gates of NMOS transistors 22, 24 are connected to their respective drains, thereby forming a diode, which are in common with I/O lines IO, nIO, respectively. NMOS transistor 26 includes a source to which an activating signal $Y_{SEL}$ is applied to couple the drains of transistors 22, 24 to ground Vss responsive to an activating signal from a column selection circuit (not shown).

A description will now be made of the operation of the prior art circuit of FIG. 1. Memory cell array 10 is of conventional construction and includes a precharge circuit precharging bit lines BL, nBL to a predetermined level, an equivelence circuit for equalizing voltage levels of bit lines BL, nBL, and a bit line sense amplifier for sensing and amplifying the difference between voltage levels appearing on bit lines BL, nBL. Prior to the beginning of a read operation, bit lines BL, nBL are each precharged and equalized to the same voltage level. When a selected memory cell in array 10 is read, a portion of the charge in the memory cell is shared with the charge on bit line BL thereby affecting the potential of bit line BL. This, therefore, generates a voltage difference in the bit lines BL, nBL which were each precharged to an equivalent potential prior to the read operation. This voltage difference may be in the range of several tens to several hundred millivolts.

The voltage difference on bit lines BL, nBL is sensed by the bit line sense amplifier (not shown) in memory cell array 10 which drives the higher voltage to the power supply level and the lower voltage to the Found voltage level. After so doing, the column selection signal CSL transmitted from the column decoder (not shown) is input to columns selection gates 12, 14. With gates 12, 14 thus turned on, the voltage on each of bit lines BL, nBL is transmitted to lines sub-I/O SIO, nSIO.

When an activating signal $Y_{SEL}$, generated by conventional column selection circuits (not shown) is transmitted to NMOS transistor 26, current sense amplifier 16 is activated. The sub-I/O lines SIO, nSIO are comprised of the same material and length with both lines being equally loaded. During a read operation one of lines BL, nBL is always high and the other is always low. PMOS transistors 18, 20 are therefore turned on to different states depending upon which of lines SIO, nSIO is high and which is low. The amount of current flowing in each of PMOS transistors 18, 20 is therefore different. Thus, one of the PMOS transistors becomes progressively more turned on while the other becomes progressively more turned off. The difference in the current flowing in each of PMOS transistors 18, 20 causes different currents likewise to flow in NMOS transistors 22, 24. This results in one of lines I/O, nI/O being at a high voltage level and the other being at a low voltage level thereby sensing the current developed by the different potentials on bit lines BL, nB1. The sensed current is associated with a voltage level on lines I/O, nI/O which corresponds to the voltage level on bit lines BL, nBL, respectively. As can be seen in FIG. 2, I/O lines IO, nIO are developed to voltage levels different from each other in accordance with the current change of the sub-I/O lines SIO, nSIO.

Current sense amplifier 16 responds at high speed which is, of course, desireable when reading from a memory. A problem arises, however, when the power supply voltage Vcc is lowered until it approaches the sum of the threshold voltagse of the transistors which are in series with each other in amplifier 16, i.e., PMOS transistor 20 and NMOS transistor 24 in the first leg of the circuit, and PMOS transistor 18 and NMOS transistor 22 in the second leg. For example, if the threshold voltage $V_{TN}$ of the NMOS transistor is 0.7 volts and the threshold voltage $V_{TP}$ of the PMOS transistor is 0.7 volts, the power supply voltage should be greater than 1.4 volts. Otherwise, current sense amplifier 16 is in a floating state which impairs its operation. With a low power supply voltage, conductance of the transistors becomes very large and the sensing speed of the current amplifier is thus reduced. In addition, it is difficult to have the same characteristics, such as threshold voltage, for each of the transistors even though all are fabricated in the same process. This results in offset in the response of each of the transistors.

SUMMARY OF THE INVENTION

It is an object of the invention to provide a current sense amplifier for use in a semiconductor memory device which operates with a low power supply voltage.

It is another object of the present invention to provide such an amplifier which has a high sensing speed even in the presence of a low power supply voltage.

It is still another object of the present invention to provide such an amplifier which is not affected by characteristic differences resulting from semiconductor fabrication processes.

It is yet another object of the present invention to provide such an amplifier which may be advantageously incorporated into a high density semiconductor memory device.

To achieve these objects, a current sense amplifier for use in a semiconductor memory device having a pair of sub-I/O lines and a pair of I/O lines comprises a first circuit leg having a first transistor in series with a second transistor. The second circuit leg has a third transistor in series with a fourth transistor. The first and third transistors each have a gate coupled to one side of the other transistor while the second transistor has a gate coupled to one side of the third transistor and the fourth transistor has a gate coupled to one side of the first transistor. A sub-I/O terminal is located at one end of each of the legs and an I/O terminal is located between the transistors in each of the legs.

BRIEF DESCRIPTION OF THE DRAWINGS

The foregoing and other objects, features and advantages of the invention will become more readily apparent when the following detailed description is read in view of the accompanying drawings in which.

DETAILED DESCRIPTION OF THE PREFERRED EMBODIMENT

Figure 1:
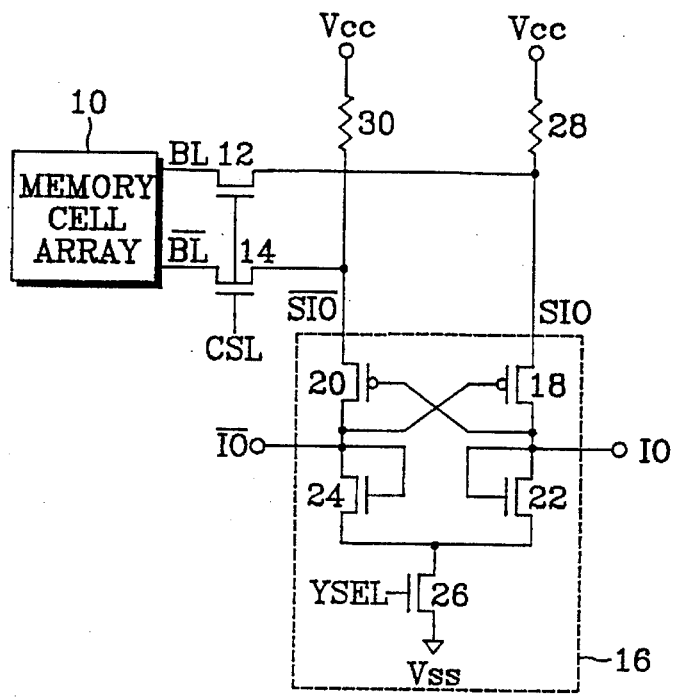
FIG. 1 is a schematic view illustrating a prior art current sense amplifier and a core part of a semiconductor memory device coupled thereto.

Similar elements in the drawings are indicated by the same reference numerals in different figures.

Figure 3:
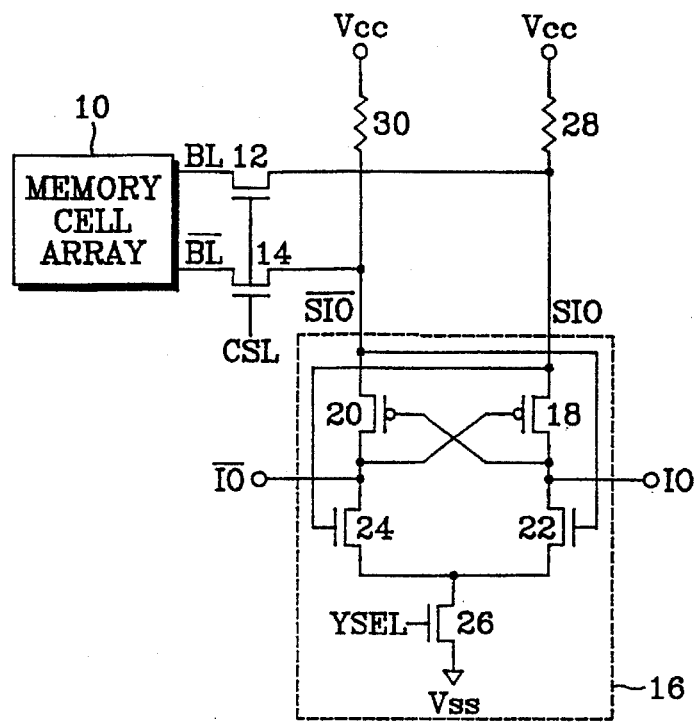
FIG. 3 is a schematic view illustrating a current sense amplifier and a core part of a semiconductor memory device coupled thereto constructed in accordance with the present invention.

Referring now to FIG. 3, the structure and operation of memory cell array 10 and gates 12, 14 is substantially identical to that described in connection with the prior art circuit of FIG. 1. The primary difference between the circuit of FIG. 3 and that of FIG. 1 is that the gates of NMOS transistors 22, 24 are not connected to their respective drains, as in FIG. 1. Rather, the gate of NMOS transistor 22 is connected to the source of PMOS transistor 20, which also functions as sub-I/O line nSIO, while the gate of NMOS transistor 24 is connected to the source of PMOS transistor 18, which is in coomon with sub-I/O line SIO.

Considering now the operation of the circuit of FIG. 3, during the read operation of one of the memory cells in array 10, bit lines BL, nBL are precharged to the same potential. Thereafter, the charge on the memory cell associated with each bit line is applied to its associated line and the voltage levels of bit lines BL, nBL are developed to a high and a low level by a bit line sense amplifier (not shown) which is incorporated in memory cell array 10. In response to the column selection signal CSL, gates 12, 14 are turned on and the voltages (one of which is high and one of which is low) developed on bit lines BL, nBL are applied to sub-I/O lines SIO, nSIO, respectively.

Since one of the voltages aplied to the sub-I/O lines is always high and the other is always low, PMOS transistors 18, 20 are turned on to different states. Due to the cross coupling of the gates of PMOS transistors 18, 20, the PMOS transistor having the higher current level therein is progressively further turned on while the PMOS transistor with the lower current level is progressively further turned off. Accordingly, one of NMOS transistors 22, 24 has a high current level while the other has a low current level. This sets up a corresponding high voltage at one of I/O lines IO, nIO and a low voltage at the other I/O line.

Because the gates of NMOS transistor 22, 24 are cross coupled with sub-I/O lines nSIO, SIO, respectively, the NMOS transistor which is conducting more current remains biased on even in the presence of a low power supply voltage Vcc. This permits high speed operation of current sense amplifiers 16 even in the presence of relatively low power supply voltage Vcc.

Figure 2:
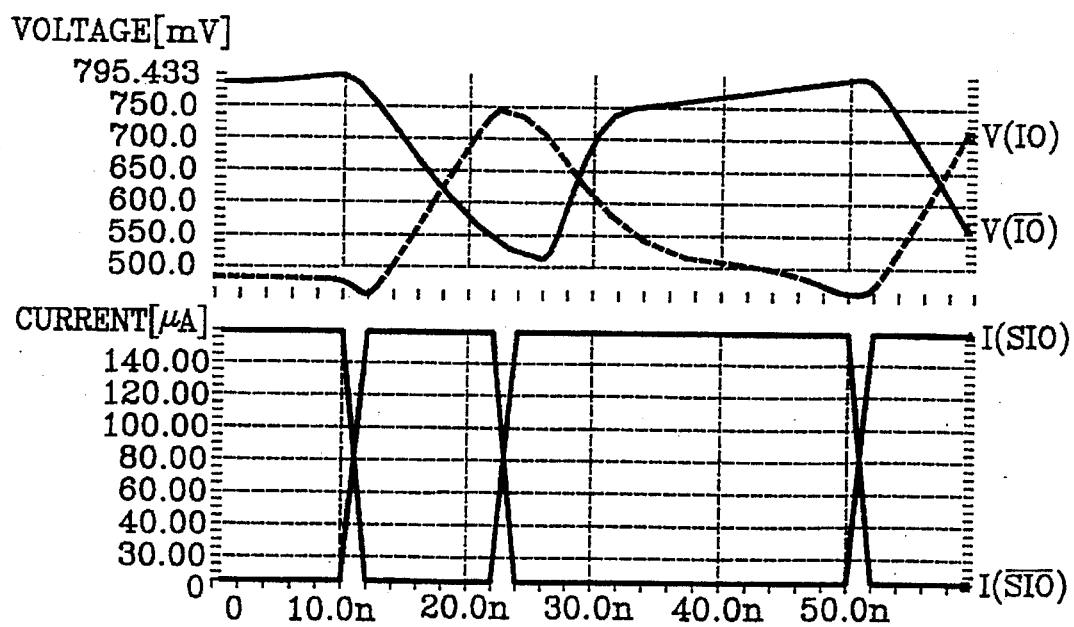
FIG. 2 shows wave forms relating current and voltage in the circuit of FIG. 1.
Figure 4:
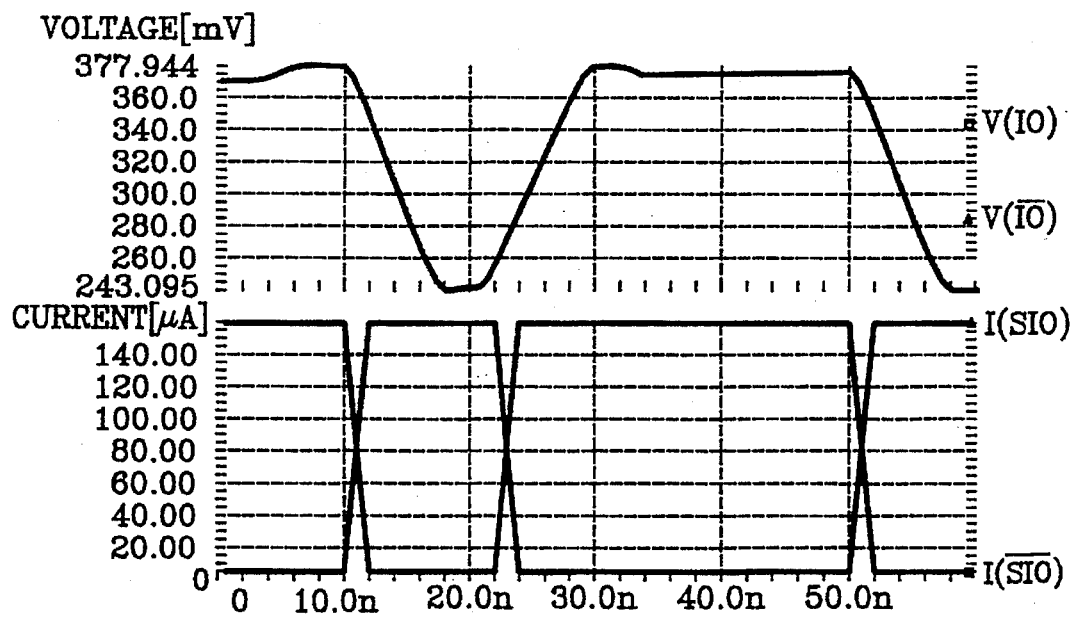
FIG. 4 shows wave forms relating current and voltage in the circuit of FIG. 3.

As can be seen in FIG. 4, the I/O lines connected to the sub-I/O lines are each developed to different voltage levels in response to the current in the sub-I/O lines. As can be seen by contrasting the voltage wave forms of FIG. 4 with those of FIG. 2, a higher speed response, albeit between a smaller voltage range, is provided. The voltage range, however, is sufficient to permit circuitry in a semiconductor memory device to classify the voltage level as being a high or low binary value.

The present invention therefore provides a current sense amplifier for use in a semiconductor memory device which has a high response speed. Because the amplifier is stable at low power supply voltages, it is ideal for use in a high density semiconductor memory device. Although in the preferred embodiment of the present invention, the transistors connected to the sub-I/O lines are constructed as PMOS transistors and the transistors connected to the I/O lines as NMOS transistors, it is well known to one skilled in the art that it is possible to apply other transistors having different polarity, and to apply a different polarity power supply, in accordance with the present invention. The wave forms of FIGS. 2 and 4 were obtained in simulation with a power supply voltage of 1.5 volts at a temperature of 23° C.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A current sense amplifier for use in a semiconductor memory device having a pair of sub-I/O lines and a pair of I/O lines comprising:

a first circuit leg having a first transistor in series with a second transistor;

a second circuit leg having a third transistor in series with a fourth transistor, said first and third transistors each having a gate coupled to one side of the other transistor, said second transistor having a gate coupled to one side of the third transistor, and said fourth transistor having a gate coupled to one side of said first transistor;

a sub-I/O terminal located at one end of each of said legs; and an I/O terminal located between the transistors in each of said legs.

2. The current sense amplifier of claim 1 wherein said first and third transistors are PMOS transistors and said second and fourth transistors are NMOS transistors.

3. The current sense amplifier of claim 2 wherein the gates of said PMOS transistors are each coupled to the drain of the other.

4. The current sense amplifier of claim 3 wherein the gate of said second transistor is coupled to the source of said third transistor.

5. The current sense amplifier of claim 4 wherein the gate of said fourth transistor is coupled to the source of said first transistor.

6. A current sense amplifier for use in a semiconductor memory device:

first and second sub-I/O lines operatively connected to bit lines in a memory cell array;

first and second I/O lines;

a fast transistor having a first side connected to said fast sub-I/O line, a second side connected to said first I/O line, and a gate connected to said second I/O line;

a second transistor having a first side connected to said first I/O line, a second side connected to a node, and a gate connected to said second sub-I/O line;

a third transistor having a first side connected to said second sub-I/O line, a second side connected to said second I/O line, and a gate connected to said first sub-I/O line; and a fourth transistor having a first side connected to said second I/O line, a second side connected to said node, and a gate connected to said first sub-I/O line.

7. The current sense amplifier of claim 6 wherein said first and third transistors are PMOS transistors and wherein said second and fourth transistors are NMOS transistors.

8. The current sense amplifier of claim 6 wherein said second and fourth transistors are PMOS transistors and wherein said first and third transistors are NMOS transistors.

9. The current sense amplifier of claim 6 wherein said amplifier further includes a fifth transistor having one side coupled to said node and the other side coupled to one side of a power supply voltage.

10. A method of operating a current sense amplifier in a semiconductor memory device of the type having a first sub-I/O line at one end of a first circuit leg comprising a first transistor in series with a second transistor; a second sub-I/O line at one end of a second circuit leg comprising a third transistor in series with a fourth transistor; a first I/O line between the first and second transistors; and a second I/O line between the third and fourth transistors, said method comprising:

biasing the second transistor with a voltage appearing on the second sub-I/O line; and biasing the fourth transistor with the voltage appearing on the first sub-I/O line.

11. The method of claim 10 wherein said method further includes:

biasing the first transistor with the voltage appearing on the second I/O line; and biasing the third transistor with the voltage appearing on the first I/O line.

12. The method of claim 10 wherein said first and third transistors are PMOS transistors and wherein said second and fourth transistors are NMOS transistors.

13. The method of claim 10 wherein said second and fourth transistors are PMOS transistors and wherein said first and third transistors are NMOS transistors.

* * * * *

UNITED STATES PATENT AND TRADEMARK OFFICE
CERTIFICATE OF CORRECTION

PATENT NO. : 5,654,928
DATED : August 5, 1997
INVENTOR(S) : Lee et al.

It is certified that error appears in the above-indentified patent and that said Letters Patent is hereby corrected as shown below:

Column 2, line 4, change "Vet" to --Vcc--;
Column 2, line 44, change "Found" to --ground--.

Signed and Sealed this

Twenty-fourth Day of February, 1998

*Attest:*

BRUCE LEHMAN

*Attesting Officer*          *Commissioner of Patents and Trademarks*

UNITED STATES PATENT AND TRADEMARK OFFICE
CERTIFICATE OF CORRECTION

PATENT NO. : 5,654,928
DATED : August 5, 1997
INVENTOR(S) : Lee et al.

Page 1 of 1

It is certified that error appears in the above-identified patent and that said Letters Patent is hereby corrected as shown below:

Column 2,
Line 4, "Vet" should read -- Vcc --.
Line 44, "Found" should read -- ground --.

Signed and Sealed this

Nineteenth Day of March, 2002

Attest:

JAMES E. ROGAN
*Attesting Officer*  *Director of the United States Patent and Trademark Office*